United States Patent [19]
Ramos et al.

[11] 3,768,986
[45] Oct. 30, 1973

[54] LAMINATED LEAD FRAME AND METHOD OF PRODUCING SAME

[76] Inventors: Richard Ramos, Santa Ana; Roger E. Haas, both of c/o Micro Science Associates, Fountain Valley, Calif. 94040

[22] Filed: Oct. 8, 1971

[21] Appl. No.: 187,728

[52] U.S. Cl. ............ 29/191.6, 29/193.5, 174/52 PE
[51] Int. Cl. ............................................ H01l 1/14
[58] Field of Search ........................ 29/191.6, 193.5; 174/DIG. 3, 52 PE, 52 S

[56] References Cited

UNITED STATES PATENTS

| | | | |
|---|---|---|---|
| 3,440,027 | 4/1969 | Hugle | 29/193.5 |
| 3,544,857 | 12/1970 | Byrne et al. | 174/52 PE UX |
| 3,628,483 | 12/1971 | Pauza | 174/DIG. 3 |
| 3,685,137 | 8/1972 | Gardiner | 29/471.1 |

*Primary Examiner*—Allen B. Curtis
*Attorney*—Marn & Jangarathis

[57] ABSTRACT

A lead frame structure for a semiconductive device package is fabricated by laminating two preformed thin sheets, the lower sheet having a fully developed set of closely spaced inner lead tips and the upper sheet having leads which terminate short of the tips. The laminated lead frame has the thickness required for handling, assembly and use. The cavity formed by the foreshortened lead tips of the upper sheet is adopted to contain beam-lead or flip-chip devices bonded directly to the lead tips of the lower sheet. The very thin lower sheet makes possible closer lead spacing than was heretofore possible with either photoetching or stamping techniques.

11 Claims, 2 Drawing Figures

INVENTORS
Roger E. Haas
Richard Ramos
BY
Marn & Jangarathis
ATTORNEYS

LAMINATED LEAD FRAME AND METHOD OF PRODUCING SAME

BACKGROUND OF THE INVENTION

1. Field of the Invention

The present invention relates generally to packages for semiconductive devices such as integrated circuits and other miniature electronic components and, more particularly, it relates to the lead structures utilized in said packages which connect the circuits or components to a circuit board or other larger electronic unit. The invention will be described with reference to a dual in-line package (or D.I.P.) wherein the thin, rectangular package is provided with two parallel rows of leads extending outwardly from the long sides of the package, but it is to be understood that the invention is not so limited.

The terms "medium scale integration" (M.S.I.) and "large scale integration" (L.S.I.) refer to the increasing density of electrical and electronic components which can be fabricated in a given unit of volume, and reflect significant advances in integrated circuit technology. Concomitant with these advances is the increasingly serious problem of connecting a larger number of contact areas having smaller dimensions into an external circuit. While wire-bonding equipment is available for this purpose, the time, effort, expense and reliability of this technique suffers as the task assigned becomes more complex. Typically, an integrated circuit having a plurality of external contact pads deposited on its upper surface is first bonded to a substrate. A lead structure is also bonded to the substrate, and wire-bonding equipment is employed to connect each contact pad and a specific lead with a fine gold wire, one at a time. The operator must employ a microscope to observe what he is doing with the manipulators. Bonding is generally by thermocompression or ultrasonic techniques.

More recently, so-called beam-lead and flip-chip integrated circuits have become available. The former has a lead structure formed integrally with the circuit but which extends beyond the edges of the device, rather than the conventional contact pads. The latter has contact pads, but they are raised well above the surface of the device. Both types are adapted to be bonded directly to the lead structure on the substrate, thus eliminating wire bonding. Further, techniques are being perfected for bonding all of the leads (on a beam lead) or raised contact pads (on a flip-chip) simultaneously, thus greatly simplifying the entire interconnection problem. But, as the leads or pads become smaller and more closely spaced, the problems associated with producing the similarly fine lead structure on the substrate become more serious.

Metallizing paste can be applied to a ceramic substrate with a silk screen and subsequently plated, but there are severe limitations as to fineness of pattern obtainable imposed by both steps. Further, a metallized pattern needs some sort of other external connection, and any increase in the number of interconnections always leads to a decrease in ultimate yield.

Lead frame patterns stamped from thin metal sheets have achieved wide use. Briefly, a blank is first punched (or drilled) to provide pilot holes which are used to keep the blank properly located through subsequent operations. Then a stamping head stamps out the lead frame pattern, the leads being integral with suitable webs to maintain the stamped blank as a unitary structure. The substrate and leads are then bonded together, and the supporting webs are removed in a second stamping operation. While this is a simple and straightforward operation, it is subject to limitations which become manifest as the size and spacing of the lead tips decrease. Specifically, the cost of necessary tooling rises significantly as the pattern becomes finer. More important, if tool wear is constant on both large and fine-lead pattern tools, the life of fine-patterned tools will be much shorter, since the tolerances (measured as plus or minus a given percentage of a dimension) will be reached much sooner. Also, while tool wear may be considered constant regardless of pattern, the incidence of tool breakage will be sharply higher for fine pattern tools, for the simple reason that they are not as strong. Thus, while stamped lead frames have many applications in the industry (and may in fact be employed in the present invention), they are not suited for economic production of very fine patterns.

The third method of fabricating lead frame structures which has enjoyed success is photoetching. Briefly, a photoresist is applied to the surface of a blank and it is exposed to a negative of the desired lead pattern. The unexposed areas are then removed, leaving the desired pattern protected. Etching follows. The inherent accuracy of photolithographic techniques — also used to produce integrated circuits — makes the production of very fine patterns relatively easy. However, leads require structural strength if they are to extend beyond the package, and a thickness of about 0.010 in. is generally specified. Those skilled in the art will appreciate that as a pattern becomes finer, undercutting of the pattern by the etchant becomes more serious, since the etchant works with equal speed on all exposed metal, including the "wall" of metal under the resist. Thus, with the lead thickness being a predetermined factor, there is a definite limit to the fineness of lead pattern that can be produced by photoetching.

2. Prior Art

The prior art recognizes that the direct bonding of integrated circuits to lead structures requires a thinner lead than structural requirements dictate. Accordingly, in U. S. Pat. No. 3,436,810, it is disclosed to initially spot-face a depression or cavity in the blank, coat the depressed surface with aluminum with a plasma gun to improve bonding properties, and then stamp the lead frame structure with a conventional stamping head. This method is of course subject to all the above-noted limitations for stamping lead frames and, in fact, the disclosed lead sizes and spacings are conventional for stamped parts. If very fine patterns were to be produced by this method, other problems would arise. The first is movement of a lead or leads after stamping with shorting against an adjacent lead. This movement is caused, apparently, by strains induced in the leads during stamping; the greater the distance between a lead tip and the point where it is attached to the frame, the greater its post-stamping movement. Of course, the finer the spacing between lead tips, the less such movement can be tolerated. As noted above, tool wear and breakage become more serious as the lead tip pattern becomes finer. Specifically, sintered carbide cutting members must be employed if long life is desired, and this is a brittle material. With less than 0.010 in. patterns, required stamping forces are equal or greater than the strength of the carbide, and breakage results.

Probably the most important problem with the patented method, from a practical viewpoint, is the time necessary to mill out the depression, in terms of what this would do to a production schedule geared to high-speed stamping equipment. If coining were substituted for spot-facing with a milling head this problem might be overcome, but the carbide coining die would be subject to sinking or failure under the pressure necessary to make the metal plastic enough to flow out from between the dies. Further, the deformation caused by coining the depression in the upper surface would work-harden the metal in this area, making tool wear and tool breakage in the subsequent stamping step even more significant.

The present invention involves the lamination of thin sheets, and of the many patents in this area, one is considered to be of interest. U. S. Pat. No. 3,174,837 recognizes that undercutting is a serious problem when one attempts to photoetch relatively thick parts, and discloses the etching of a plurality of identical parts made of stock sufficiently thin so that significant undercutting is avoided, followed by soldering the assembled sheets together to form a unitary structure having straightsided apertures. Manufacture of an oscilloscope viewing screen by this method is specifically described.

OBJECTS OF THE INVENTION

A general object of the present invention is to provide a novel lead frame structure for packaging an integrated circuit.

Another object of the present invention is to provide a novel method of making an improved lead frame structure.

Still another object of the present invention is to provide a novel lead frame structure and method of making same which is capable of reliably producing finer lead patterns than prior art methods and structures.

Yet another object of the present invention is to provide a novel, fine patterned lead frame structure particularly adapted for use with direct-bonding devices such as beam-lead and flip-chip integrated circuits.

Various other objects and advantages of the invention will become clear from the following description of embodiments thereof, and the novel features will be particularly pointed out in connection with the appended claims.

THE DRAWINGS

For illustrative purposes reference will be made to the accompanying drawings, wherein:

FIG. 1 is a plan view of a dual in-line 14 lead integrated circuit lead frame; and FIG. 2 is a cross-sectional elevation taken along line II—II of FIG. 1.

DESCRIPTION OF EMBODIMENTS

Figure 1:
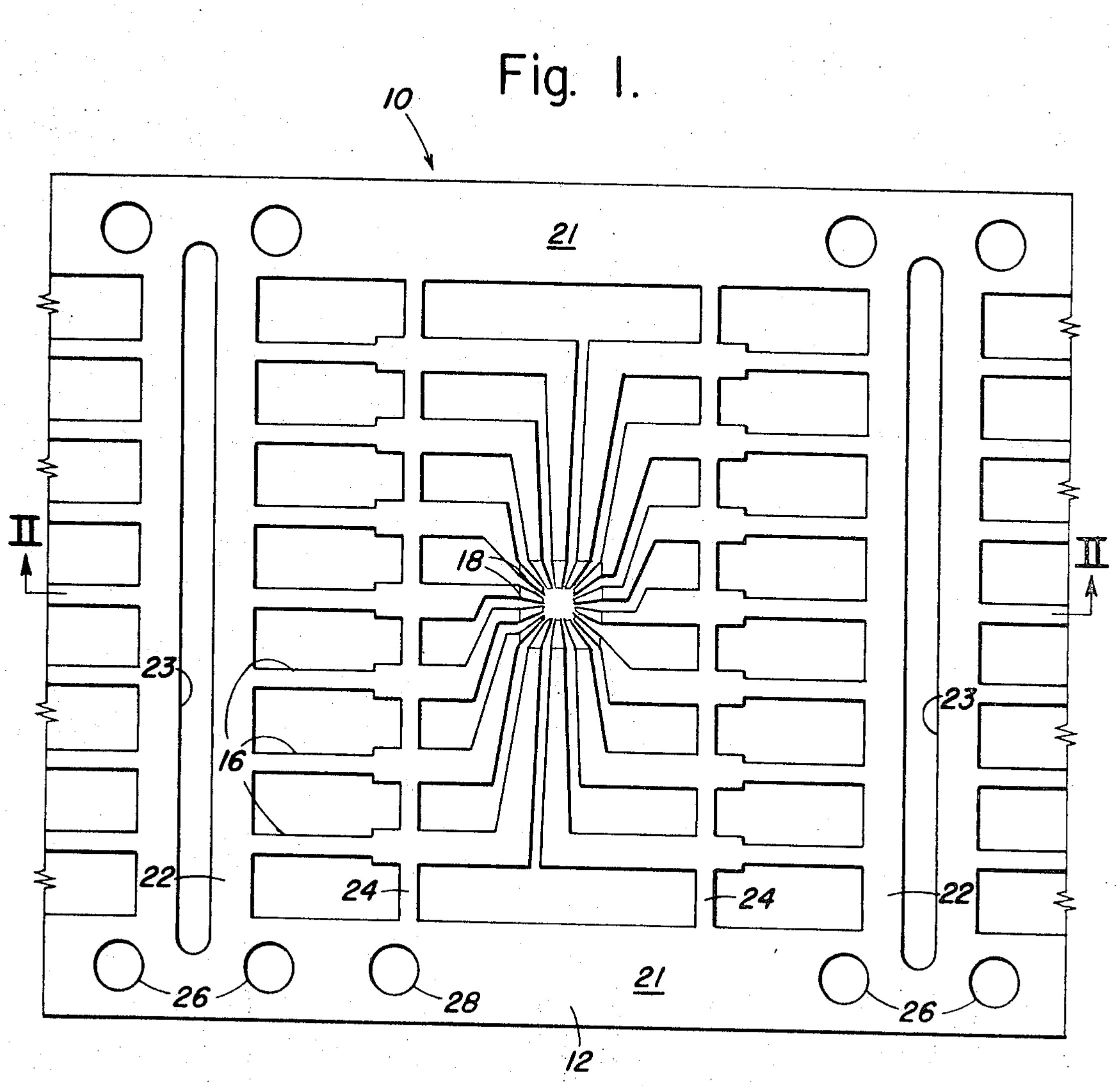

For ease of understanding and to avoid undue complexity in the drawings, the invention is described with reference to the manufacture of a "standard" lead frame, the frame for a 14-lead dual in-line package. Many millions of such packages are manufactured annually, and while the present invention may be readily incorporated into such a package, it is to be understood that the invention may be employed to even greater advantage in more complex packages (72 and 144 lead packages are known).

In essence, the present invention provides a lead frame of a desired thickness which is manufactured from two thinner pieces laminated together. The lower piece comprises the entire lead frame structure, including the tips of the leads, and is sufficiently thin so that a pattern of desired fineness at the lead tips can be produced therein. The upper piece is identical in pattern with the lower piece except the lead tips are not included. Its thickness is such that, when joined with the lower piece, a frame of specified thickness is produced. The resulting structure has a recess or cavity in its upper surface for containment of the circuit, which circuit is bonded directly to the lead tips of the lower piece. Of course, whether or not the circuit chip is totally contained depends on the relative depth of the cavity and thickness of the chip; it will be at least partially contained in any event. Laminating is carried out by coating the lower surface of the upper piece with a bonding material (solder, brazing alloy, etc.) and heating the clamped pieces to an appropriate temperature. This avoids the presence of a liquid phase in the area of the lead tips during bonding, which could cause shorting of finely spaced leads.

A double thickness, dual in-line lead frame 10 is illustrated in the drawings; those skilled in the art will appreciate that the single frame shown is one of a plurality of identical frames formed in a strip or coil. In the instant case, seven frames are manufactured from blanks measuring about 1 in. by 7 in., i.e., the area shown in FIG. 1 measures about 1 inch square. Lead frames are commonly manufactured from glass-sealing alloys, so-called because they have coefficients of thermal expansion similar to the glasses used to seal the leads in the finished package. However, other metals such as copper or aluminum are also used. In the instant case, the frame is made of Kovar (trademark), an iron-nickel-cobalt glass-sealing alloy.

Figure 2:
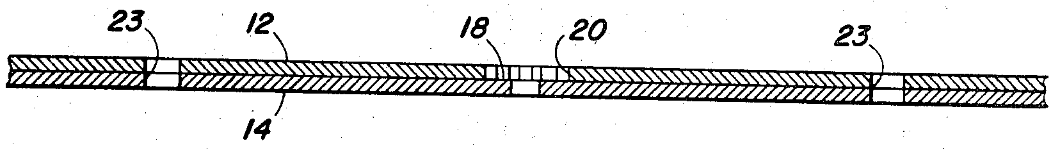

With reference to the drawings, the lead frame 10 comprises an upper sheet 12 and a lower sheet 14 laminated together in a manner to be described. Sheets 12 and 14 are identical except that sheet 14 contains the complete structure of leads 16, including tips 18 at the innermost ends thereof, whereas on sheet 12 the leads terminate short of inner tips 18, forming a recessed area or cavity 20, as seen in FIG. 2. Continuous side portions 21 maintain the integrity of the blank from frame to frame. The fourteen leads 16 are divided into two opposed rows of seven parallel leads, and each row terminates at and is integral with a web 22 communicating with side portions 21. Slit openings 23 in webs 22 facilitate cutting the blank into individual units. Structural integrity during fabrication and assembly is insured by providing two additional integral webs 24 mid-way along the length of each row of leads. These are parallel to webs 22 and are also integral with side portions 21. Of course, after assembly webs 22, 24 are cut away leaving the fourteen leads electrically isolated and, at that point, supported by the package assembly. Index holes 26 insure proper registration during fabrication and assembly, and an additional hole 28, on one side only, insures proper orientation.

The relative thickness of sheets 12 and 14 will vary with the size and spacing of leads 16, most particularly lead tips 18. Thus, for the package of FIG. 1, both sheets can be fabricated out of 0.005 in. stock. With a very fine array of lead tips 18, however, it would be necessary for bottom sheet 14 to be thinner, for example 0.003 in. or less, so that the pattern could be photoetched without undercutting. Top sheet 12 would be proportionally thicker, to provide structural strength. Also, while photoetching is the preferred method of fabricating bottom sheet 14 for the reasons noted previously, particularly when producing very fine lead tip patterns, it is to be noted that since bottom sheet 14 is very thin and it will be in the fully soft condition (as opposed to work-hardened) it will be amenable to the stamping of finer patterns than were previously economically possible, because tool wear and breakage will be reduced. The fabrication of top sheet 12 is not as critical, since it does not carry the pattern of lead tips 18. Stamping or photoetching may be employed; factors affecting the desirability of each, as previously outlined, will obviously be considered.

Lamination of sheets 12 and 14 follows. The first step is to coat a solder or brazing material on the underside of top sheet 12. Selection of this material will largely depend on the end-use the finished circuit is destined for. Thus, if the circuit must withstand rigid thermal cycling as called for by many military specifications, high-melting materials will be used. For less rigid requirements, soft solders will be acceptable. It is preferred to plate a thin layer of the bonding material on the lower surface of sheet 12 only; this prevents any liquid phase from forming on lead tips 18, where it might cause shorting, particularly on fine lead patterns. Whether bonding material is on both sides of sheet 12 or just the lower side is not important unless more than one frame is to be stacked up for bonding. With the bonding material in place sheets 12 and 14 are placed in a ceramic jig having pins corresponding to pilot holes 26, 28 insuring accurate registration. A ceramic lid is placed over the assembly and, preferably, clamped down to hold the pieces tightly together. This assembly is then passed through a furnace maintained at a sufficient temperature to bond the two pieces into a unitary structure.

An alternative and in fact preferable method of laminating the two pieces is described and claimed in U.S. Pat. No. 3,667,110 issued 6 June 1972 and assigned to Contacts, Inc., a related company to the assignee of the instant application. In brief, this method involves plating sheet 12 with successive very thin layers of copper and silver, oxidizing it in a reducing atmosphere, and bonding the two pieces at 1,500°F. for 1–2 minutes in a reducing atmosphere. This method produces excellent lamination without any gross liquid phase being formed.

With conventional lead frames, including those disclosed in U.S. Pat. No. 3,436,810 discussed above, it is often desired to provide the lead tips with a coating of a metal which facilitates bonding, commonly aluminum. Conventionally, a stripe or dots of this metal are applied to the blank prior to fabrication, by hot cladding; vapor deposition or plating and etching, so that it covers the lead tips and a portion only of the lead structure. The noted patentee discloses use of a plasma gun or vapor deposition through a mask to coat only the lead tips, followed by a re-forming operation. In accordance with the present invention, the entire upper surface of lower sheet 14 may be coated with such a metal, by any convenient process, prior to fabrication of the lead structure. Nothing further need be done since, after lamination, only the exposed lead tips show the bond-facilitating material; use of masks, etchants or other expedients is avoided. Of course, in this case a low-temperature bonding cycle is required so as not to melt the aluminum.

After lamination, the lead frame structure is handled in the conventional fashion, and the integrated circuit package into which it is assembled is conventional in other respects. These procedures need not be described in detail herein other than to note that at some point the substrate, which is smaller than the area bonded by webs 24 and edges 21, is bonded to the inner ends of the leads. The device is then bonded to lead tips 18, and a cover and a sealant hermetically seal the package. At some point prior to testing, webs 22, 24 are cut off, so that leads 16 are electrically isolated from each other.

Various changes in the details, steps, materials and arrangements of parts, which have been herein described and illustrated in order to explain the nature of the invention, may be made by those skilled in the art within the principle and scope of the invention as defined in the appended claims.

What is claimed is:

1. A laminated lead frame assembly for use in a semiconductive device package comprising:

a horizontal array of lead members having inner tips disposed so as to accomodate said device, said lead members being held flat within said frame by integral web means;

said frame comprising upper and lower sheets laminated at adjoining surfaces;

said lower sheet containing said array of lead members including said inner tips;

said upper sheet containing said array of lead members excepting said inner tips;

said upper and lower sheets cooperating to form a recess above said inner tips for at least partial containment of said device.

2. The lead frame assembly as claimed in claim 1, wherein the thickness of said lower sheet is small enough to allow the formation of said lead tips of a desired size and spacing.

3. The lead frame assembly as claimed in claim 2, wherein the thickness of said upper sheet is sufficient to provide said frame with required structural strength.

4. The lead frame assembly as claimed in claim 3, wherein the overall thickness of said assembly is about 0.010 in., and the thickness of said upper sheet is at least about 0.005 in.

5. The lead frame assembly as claimed in claim 1, and additionally comprising a coating of bond-facilitating metal on the upper surface of said lower sheet.

6. The method of fabricating a lead frame assembly for use in a semiconductive device package comprising;

forming a first, flat lead frame element including an array of lead members having inner tips disposed so as to accommodate said device, said lead members being held within said frame by integral web means;

forming a second, flat lead frame element similar in plan to said first element but with an enlarged opening in place of said inner tips; and laminating said first and second elements together on major surfaces thereof with similar lead members in registration, said opening in said second element forming a recess above said inner tips for at least partial containment of said device.

7. The method as claimed in claim 6, wherein said second element is formed from stock thin enough to allow said inner tips to be of a desired size and spacing.

8. The method as claimed in claim 6, wherein said second element is formed from stock thick enough to provide said frame with required structural strength.

9. The method as claimed in claim 7, wherein said first element is formed photoetching said array and said webs in said stock.

10. The method as claimed in claim 6, wherein said laminating is carried out by coating the surface of said second element to be joined to said first element with a suitable bonding material, and heating and pressing said elements together to effect lamination.

11. The method as claimed in claim 4, wherein the surface of said first element laminated to said second element has a bond-facilitating metal coated thereon.

* * * * *

PO-1050
(5/69)

UNITED STATES PATENT OFFICE
CERTIFICATE OF CORRECTION

Patent No. 3,768,986 Dated October 30, 1973

Inventor(s) Richard Ramos et al

It is certified that error appears in the above-identified patent and that said Letters Patent are hereby corrected as shown below:

The listing of inventors (item 76) should read as follows:

Inventors: Richard Ramos, Santa Ana; Roger E. Haas, Fountain Valley, Calif.; both c/o Micro Science Associates, Mountain View, Calif.

Column 8, line 6: "claim 4" should read --claim 6--.

Signed and sealed this 5th day of March 1974.

(SEAL)
Attest:

EDWARD M.FLETCHER,JR.
Attesting Officer

C. MARSHALL DANN
Commissioner of Patents

15¢